United States Patent [19]
Swoboda

[11] Patent Number: 5,657,328
[45] Date of Patent: Aug. 12, 1997

[54] SCAN DESIGN WITH EXPANDED ACCESS CAPABILITY

[75] Inventor: Gary L. Swoboda, Sugar Land, Tex.

[73] Assignee: Texas Instruments Incorporated, Dallas, Tex.

[21] Appl. No.: 155,419

[22] Filed: Nov. 19, 1993

[51] Int. Cl.$^6$ .................................................. G01R 31/28
[52] U.S. Cl. .................. 371/22.3; 371/22.5; 324/73.1
[58] Field of Search ........................ 371/22.3, 15, 22.1, 371/22.5, 25.1; 324/73 R, 73.1; 395/856; 365/189.02, 189.03

[56] References Cited

U.S. PATENT DOCUMENTS

| | | | |
|---|---|---|---|
| 4,872,169 | 10/1989 | Whetsel | 371/22.3 |
| 5,056,093 | 10/1991 | Whetsel | 371/22.3 |
| 5,132,974 | 7/1992 | Rosales | 371/22.3 |
| 5,157,627 | 10/1992 | Gheewala | 365/189.01 |
| 5,179,534 | 1/1993 | Pierce et al. | 365/189.01 |

OTHER PUBLICATIONS

Colin M. Maunder and Rodham E. Tulloss, "The Test Access Port and Boundary-Scan Architecture", IEEE Computer Society Press Tutorial, Chapter 13. Single Transport Chain, pp. 151–157, 1990.

*Primary Examiner*—Robert W. Beausoliel, Jr.
*Assistant Examiner*—Nadeem Iqbal
*Attorney, Agent, or Firm*—Scott B. Stahl; Leo N. Heiting; Richard L. Donaldson

[57] ABSTRACT

A serial scan design permits shift element (71) to selectively access more than one node (43) of a target circuit (14).

20 Claims, 3 Drawing Sheets

SCAN DESIGN WITH EXPANDED ACCESS CAPABILITY

FIELD OF THE INVENTION

The invention relates generally to serial scan design and, more particularly, to an improved scan design with expanded access capability.

BACKGROUND OF THE INVENTION

Serial scan designs are used to access the functionality of targeted electrical circuitry for emulation and test purposes. Such scan designs typically include a plurality of serially connected shift elements. Each shift element is operatively associated with a predetermined node of the target circuit to provide access to that node for emulation and/or test purposes. This type of arrangement disadvantageously requires a one-to-one ratio of shift elements to accessed nodes.

It is therefore desirable to provide a scan design which can access a given number of nodes without requiring a one-to-one ratio of shift elements to accessed nodes.

The present invention provides the aforementioned desirable scan design using circuitry that permits a shift element to selectively access more than one node of the target circuit.

DETAILED DESCRIPTION

Figure 1:
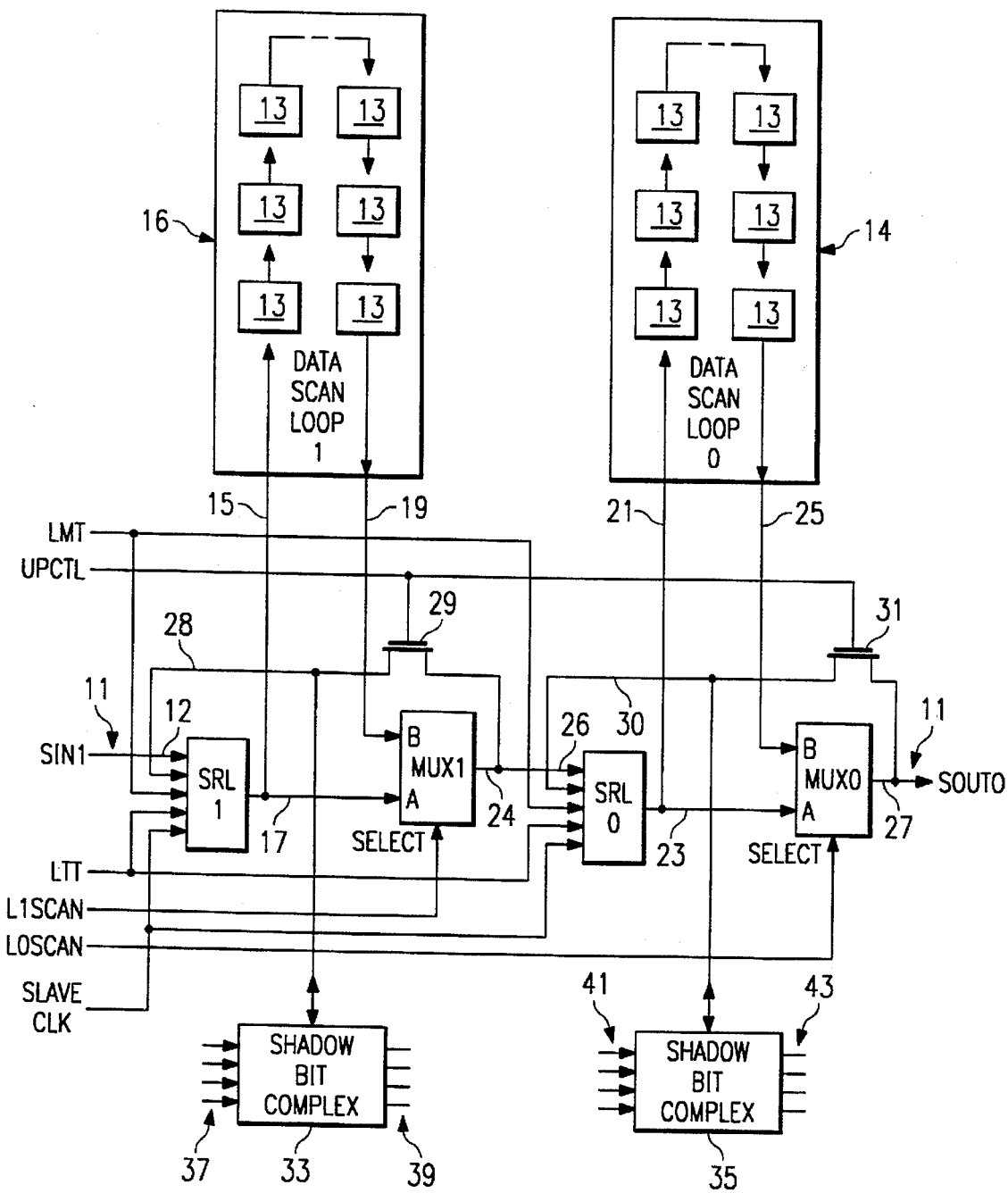
FIG. 1 illustrates an exemplary scan design according to the invention.

FIG. 1 illustrates exemplary serial scan circuitry according to the invention. The serial scan circuitry of FIG. 1 includes a serial scan path 11 having an input SIN1 and an output SOUT0. The serial scan path 11 illustrated in FIG. 1 includes shift register latches SRL1 and SRL0, and multiplexers MUX1 and MUX0 which are respectively associated with SRL1 and SRL0. The input SIN1 of the serial scan path 11 is connected to a serial input 12 of SRL1, and the output SOUT0 of the serial scan path 11 is connected to the output 27 of MUX0. The serial scan path 11 can be selectively configured to include one or both of DATA SCAN LOOP 1 and DATA SCAN LOOP 0, which are respectively associated with SRL1 and SRL0.

DATA SCAN LOOP 1 and DATA SCAN LOOP 0 extend through respective portions 16 and 14 of the target circuitry. The target circuitry may be any type of electrical circuitry that is accessible via serial scan techniques. DATA SCAN LOOP 1 and DATA SCAN LOOP 0 each include a plurality of conventional shift register latches (SRLs) 13 connected in series with one another. The SRLs 13 provide access to the functionality of the target circuitry as is well known in the art. The serial input 15 of DATA SCAN LOOP 1 is connected to the serial output 17 of SRL1, and the serial output 19 of DATA SCAN LOOP 1 is connected to input B of MUX1. The output 24 of MUX1 is connected to the serial input 26 of SRL0. The serial input 21 of DATA SCAN LOOP 0 is connected to the serial output 23 of SRL0, and the serial output 25 of DATA SCAN LOOP 0 is connected to input B of MUX0. The output 27 of MUX0 defines the serial output SOUT0 of the serial scan path 11 illustrated in FIG. 1.

Input A of MUX1 is connected to the serial output 17 of SRL1, and input A of MUX0 is connected to the serial output 23 of SRL0. Select signal L1SCAN is connected to the select input of MUX1 to select either input A or input B of MUX1 for connection to the output 24 of MUX1, whereby DATA SCAN LOOP 1 can be selectively switched into and out of serial scan path 11. Select signal L0SCAN is connected to the select input of MUX0 to select either input A or input B of MUX0 for connection to the output 27 of MUX0, whereby DATA SCAN LOOP 1 can be selectively switched into and out of serial scan path 11. Select signals L1SCAN and L0SCAN can thus be used to configure serial scan path 11 to include both DATA SCAN LOOP 1 and DATA SCAN LOOP 0, or to bypass one or both of DATA SCAN LOOP 1 and DATA SCAN LOOP 0.

The output 24 of MUX1 is selectively connectable to an input 28 of SRL1 via pass gate 29, and the output 27 of MUX0 is selectively connectable to an input 30 of SRL0 via pass gate 31. Pass gates 29 and 31 are controlled by a signal designated as UPCTL and discussed below. SRL1 and SRL0 also receive input signals LMT, LTT and SLAVE CLK, which are discussed below.

A shadow bit complex 33 is connected to input 28 of SRL1, and a shadow bit complex 35 is connected to input 30 of SRL0. Shadow bit complex 33 has control inputs 37 and data lines 39, and shadow bit complex 35 has control inputs 41 and data lines 43. The data lines 39 and 43 can, for example, be connected to nodes within the respective portions 16 and 14 of the target circuitry, and the control inputs 37 and 41 can, for example, be included in an instruction register of the type used in the IEEE STD 1149.1 architecture.

Figure 2:
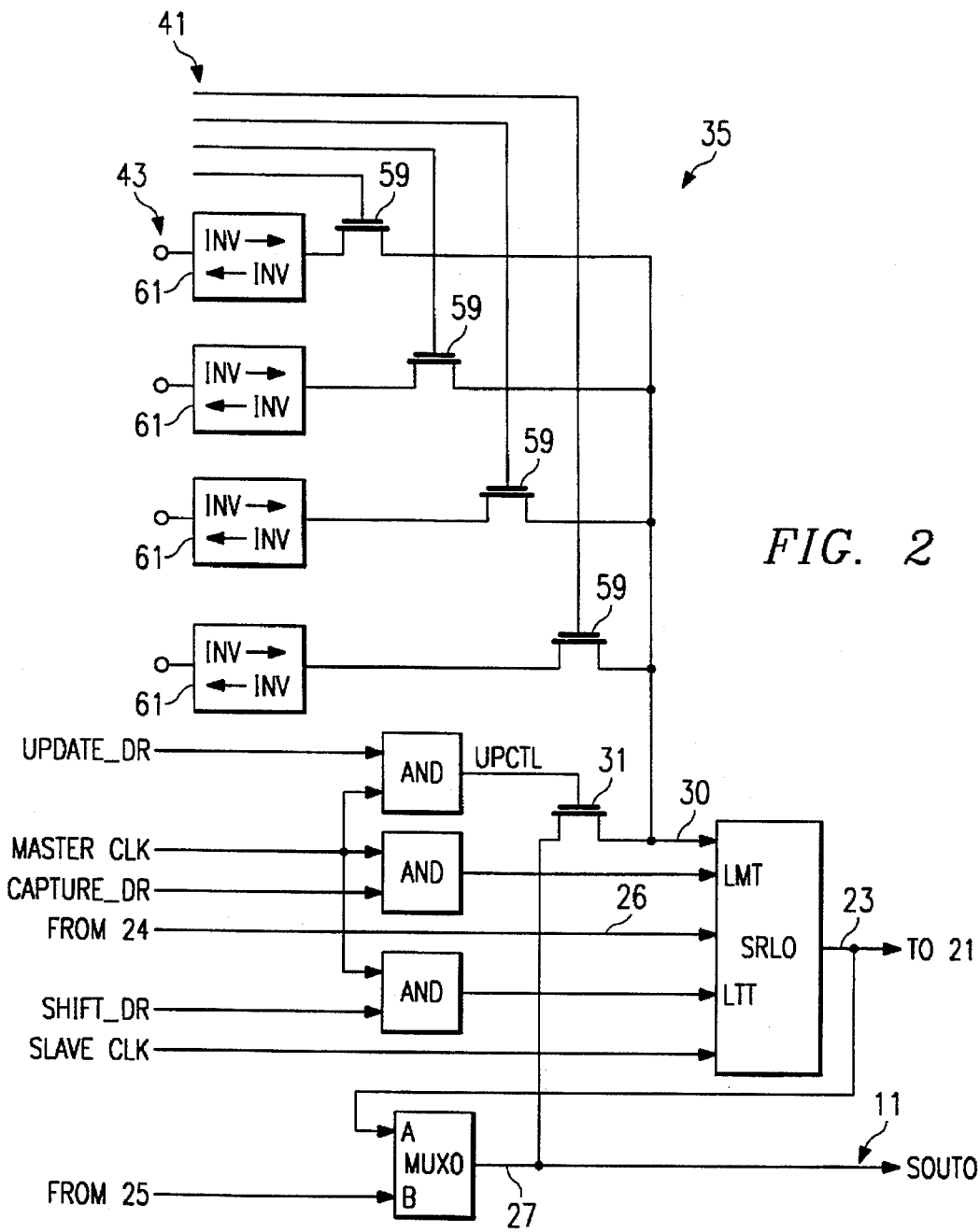
FIG. 2 illustrates in greater detail a shadow bit complex and a shift register latch of FIG. 1.

FIG. 2 illustrates SRL0 and shadow bit complex 35 in greater detail. As to SRL1 and shadow bit complex 33, the structure and operation of SRL1 can be the same as described below with respect to SRL0, and the structure and operation of shadow bit complex 33 can be the same as described below with respect to shadow bit complex 35. As shown in FIG. 2, LMT is obtained by ANDing a master clock signal, MASTER CLK, with a CAPTURE_DR signal. Thus, the master clock signal, which is normally applied directly to an SRL in conventional operation, is not applied to SRL0 of FIG. 2. Rather, MASTER CLK is ANDed with CAPTURE_DR, this latter signal being initiated at a test controller (for example a TAP controller of the type used in the IEEE STD 1149.1 architecture) to instruct SRL0 to capture data from the target circuitry. Thus, SRL0 will capture data during MASTER CLK cycles if CAPTURE_DR is active high.

Figure 4:
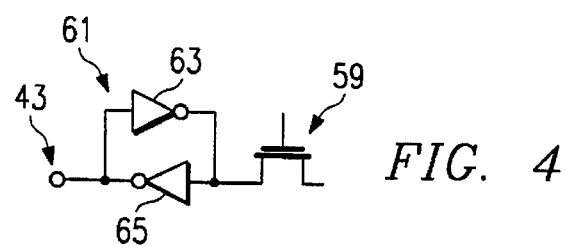
FIG. 4 illustrates in greater detail part of the shadow bit complex of FIG. 2.
Figure 3:
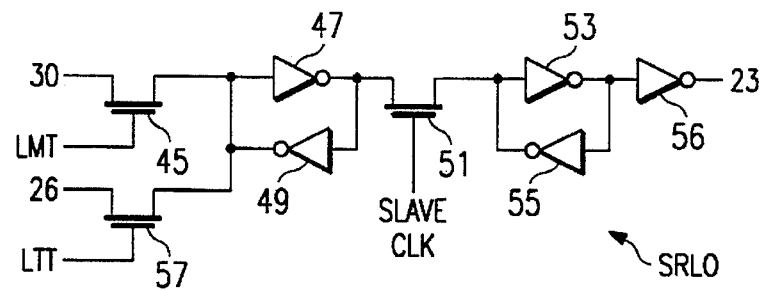
FIG. 3 illustrates the shift register latch of FIG. 2 in greater detail.

The capture operation is illustrated in FIG. 3 wherein, when LMT is high (i.e., when a MASTER CLK pulse occurs with CAPTURE_DR high), the logic state on input 30 of SRL0 is captured by virtue of passing through pass gate 45 to cross-coupled inverters 47 and 49 which form the master stage of SRL0. Upon the next pulse of SLAVE CLK, the logic state from the master stage will pass through pass gate 51 to cross-coupled inverters 53 and 55 which form the slave stage of SRL0, making the captured logic state available via inverter 56 at serial output 23 of SRL0. The input 30 can be connected to a selected one of the data lines 43 by activating the control input 41 that controls the pass gate 59 associated with the selected data line 43, whereby the selected data line 43 is connected to the input 30 via a cross-coupled inverter pair 61 (FIG. 4 shows inverters 63 and 65 of cross-coupled inverter pair 61) and the associated pass gate 59. Thus, by activating the appropriate control input 41, the logic state of a selected one of the data lines 43 can be captured by SRL0 at its input 30. Only one of the control inputs 41 should be activated at any given point in time.

Signal LTT is obtained by ANDing MASTER CLK with SHIFT_DR, this latter signal being initiated at the test controller to instruct SRL0 to shift data from its serial input 26 to its serial output 23. Thus, SRL0 will shift data from its serial input 26 during MASTER CLK cycles if SHIFT_DR is active high. This operation is illustrated in FIG. 3 wherein, when LTT is high (i.e., when a MASTER CLK pulse occurs with SHIFT_DR high), the logic state on serial input 26 is shifted through pass gate 57 to the master stage of SRL0. Upon the next pulse of SLAVE CLK, the logic state from the master stage will pass through pass gate 51 to the slave stage of SRL0, making the logic state available (via inverter 56) at serial output 23 of SRL0.

Signal UPCTL is obtained by ANDing MASTER CLK with UPDATE_DR, this latter signal being initiated at the test controller to instruct SRL0 to update data to the target circuitry. Thus, data will be updated to the target circuitry during MASTER CLK pulses if UPDATE_DR is active high. That is, UPCTL will go active high to connect the output 27 of MUX0 (or the output 23 of SRL0 if no bypass multiplexing is used) to a selected one of the data lines 43 via the associated pass gate 59. Selection of a data line 43 to be updated is accomplished by activating the one control input 41 that controls the pass gate 59 connected to the selected data line 43. Only one of the control inputs 41 should be activated at any given point in time.

It should be understood that the structure of SRL0 and SRL1 can be used in any of the SRLs 13 of FIG. 1, so that any of the illustrated SRLs can operate in conjunction with a shadow bit complex as described above.

Figure 5:
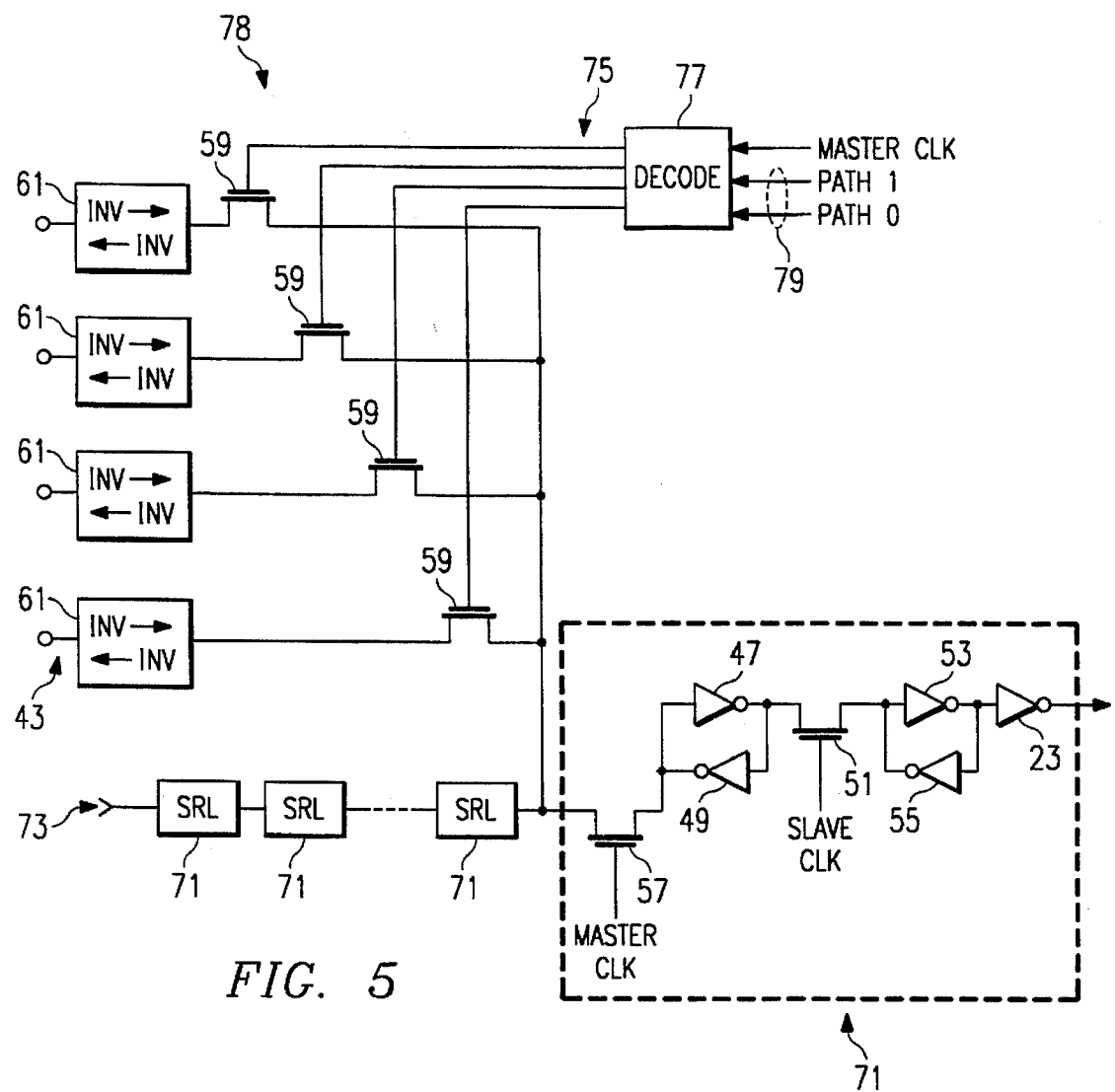
FIG. 5 illustrates another exemplary scan design according to the invention.

FIG. 5 illustrates further exemplary serial scan circuitry according to the invention. Elements in FIG. 5 which function analogously to previously described elements are indicated with like reference numerals. FIG. 5 includes a plurality of serially connected SRLs 71 forming a scan path 73. The SRLs 71, one of which is shown in detail, are similar to SRL0 and SRL1 of FIGS. 1–3, except that SRLs 71 do not include the LMT input and input 30 of SRL0 and SRL1, and SRLs 71 receive MASTER CLK as an input in place of the LTT input of SRL0 and SRL1. The data lines 43 of the FIG. 5 shadow bit complex 78 can be captured by or updated from the scan path 73 using outputs 75 of decode logic 77 to appropriately control pass gates 59. Decode logic 77 has a MASTER CLK input and a coded input 79 including input signals PATH0 and PATH1. The input signals PATH0 and PATH1 can, for example, be included in an instruction register of the type used in the IEEE STD 1149.1 architecture. The design of FIG. 5 assumes that the logic state of the data lines 43 is a don't care while data is being shifted through the scan path 73. Under this assumption, the design of FIG. 5 is desirable from both cost and chip real estate standpoints.

Figure 6:
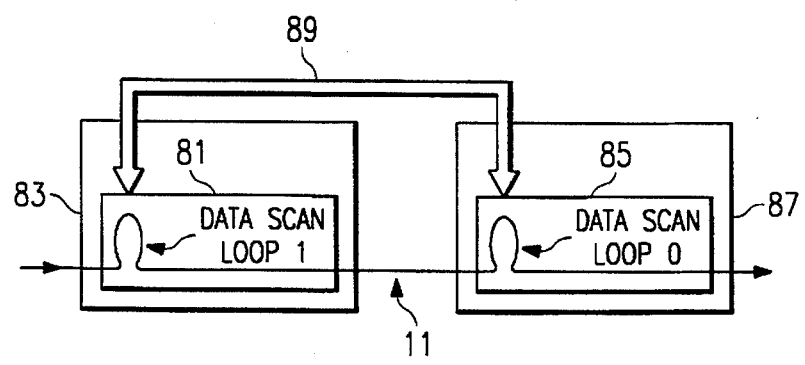
FIG. 6 illustrates an exemplary electronic system according to the invention.

As indicated above, the target circuitry can be any type of electrical circuitry that is accessible via serial scan techniques. For example, target circuitry portions such as 14 and 16 of FIG. 1 could be portions of a single integrated circuit, or portions of plural separate integrated circuits. Moreover, the separate integrated circuits could be on one circuit board in one piece of equipment, on plural separate circuit boards in one piece of equipment, or on plural circuit boards respectively resident in plural separate pieces of equipment. As one example: a microprocessor resident on a circuit board of one piece of equipment can be designed to include DATA SCAN LOOP 1, SRL1, MUX1, shadow bit complex 33 and pass gate 29 of FIG. 1, with target circuitry portion 16 of FIG. 1 being a part of the circuitry of the microprocessor; and a peripheral device, operating in conjunction with the microprocessor and resident on a circuit board of another piece of equipment, can be designed to include DATA SCAN LOOP 0, SRL0, MUX0, shadow bit complex 35 and pass gate 31 of FIG. 1, with target circuitry portion 14 of FIG. 1 being a part of the circuitry of the peripheral device. FIG. 6 diagrammatically illustrates such an exemplary system wherein microprocessor 81 of equipment 83 is provided with DATA SCAN LOOP 1 (and the aforementioned associated circuitry of FIG. 1), and peripheral device 85 of equipment 87 is provided with DATA SCAN LOOP 0 (and the aforementioned associated circuitry of FIG. 1). A communication link 89 connects microprocessor 81 and peripheral device 85 to permit cooperation therebetween. As examples, peripheral device 85 could be an image sensor, equipment 87 could be a video camera, and equipment 83 could be an image processing computer.

Although exemplary embodiments of the invention are described above, this does not limit the scope of the invention, which can be practiced in a variety of embodiments.

What is claimed is:

1. Access circuitry for accessing a target circuit to evaluate operation of the target circuit, comprising:
 a serial scan path for permitting data to be shifted through the target circuit, said serial scan path including a plurality of serially connected shift elements operative to access respective nodes of the target circuit; and
 circuitry for coupling one of said shift elements to a plurality of nodes of the target circuit and for permitting said one shift element to selectively access any selected one of said nodes for bidirectional data communication between said one shift element and the selected node.

2. The circuitry of claim 1, wherein said circuitry for coupling and permitting includes a plurality of switch elements respectively connected to said plurality of nodes and connected to an input of said one shift element and selectively connectable to an output of said one shift element.

3. The circuitry of claim 1, wherein said circuitry for coupling and permitting includes circuitry for capturing at said one shift element a logic state of the selected node.

4. The circuitry of claim 3, wherein said circuitry for capturing includes a plurality of switch elements respectively connected to said plurality of nodes and connected to an input of said one shift element.

5. The circuitry of claim 1, wherein said circuitry for coupling and permitting includes circuitry for applying to the selected node a logic state of said one shift element.

6. The circuitry of claim 5, wherein said circuitry for applying includes a switch element connected to an output of said one shift element and selectively connectable to said plurality of nodes.

7. The circuitry of claim 6, wherein said circuitry for applying includes a plurality of further switch elements respectively connected to said plurality of nodes and also connected to said first-mentioned switch element.

8. The circuitry of claim 1, wherein said circuitry for coupling and permitting includes circuitry for capturing at said one shift element a logic state of the selected node, and also includes circuitry for applying to the selected node a logic state of said one shift element.

9. The circuitry of claim 8, wherein said circuitry for capturing includes a plurality of switch elements respectively connected to said plurality of nodes and connected to an input of said one shift element, and wherein said circuitry for applying includes a further switch element connected to an output of said one shift element and connected to said plurality of switch elements.

10. An electronic device, comprising:

functional circuitry for performing normal operating functions of said device; and access circuitry for accessing said functional circuitry to evaluate operation thereof, including a serial scan path for permitting data to be shifted through said functional circuitry, said serial scan path including a plurality of serially connected shift elements operative to access respective nodes of said functional circuitry, and said access circuitry including circuitry coupling one of said shift elements to a plurality of nodes of said functional circuitry for permitting said one shift element to selectively access any selected one of said nodes for bidirectional data communication between said one shift element and the selected node.

11. The device of claim 10, wherein said circuitry for permitting includes a plurality of switch elements respectively connected to said plurality of nodes and connected to an input of said one shift element and selectively connectable to an output of said one shift element.

12. The device of claim 10, wherein said circuitry for permitting includes circuitry for capturing at said one shift element a logic state of the selected node, and also includes circuitry for applying to the selected node a logic state of said one shift element.

13. The device of claim 12, wherein said circuitry for capturing includes a plurality of switch elements respectively connected to said plurality of nodes and connected to an input of said one shift element, and wherein said circuitry for applying includes a further switch element connected to an output of said one shift element and connected to said plurality of switch elements.

14. The device of claim 10, wherein said functional circuitry of said device is a microprocessor.

15. An electronic system, comprising:

a plurality of interconnected pieces of electronic equipment, each said piece of electronic equipment including functional circuitry for performing normal operating functions thereof, one of said pieces of electronic equipment including access circuitry for accessing said functional circuitry to evaluate operation thereof; and said access circuitry including a serial scan path for permitting data to be shifted through said functional circuitry, said serial scan path including a plurality of serially connected shift elements operative to access respective nodes of said functional circuitry, and said access circuitry including circuitry coupling one of said shift elements to a plurality of nodes of said functional circuitry for permitting said one shift element to selectively access any selected one of said nodes for bidirectional data communication between said one shift element and the selected node.

16. The system of claim 15, wherein said circuitry for permitting includes a plurality of switch elements respectively connected to said plurality of nodes and connected to an input of said one shift element and selectively connectable to an output of said one shift element.

17. The system of claim 15, wherein said circuitry for permitting includes circuitry for capturing at said one shift element a logic state of the selected node, and also includes circuitry for applying to the selected node a logic state of said one shift element.

18. The system of claim 17, wherein said circuitry for capturing includes a plurality of switch elements respectively connected to said plurality of nodes and connected to an input of said one shift element, and wherein said circuitry for applying includes a further switch element connected to an output of said one shift element and connected to said plurality of switch elements.

19. The system of claim 15, wherein said one piece of electronic equipment is an image processing computer.

20. The system of claim 19, wherein said functional circuitry of said image processing computer includes a microprocessor.

* * * * *